United States Patent
Huo et al.

(10) Patent No.: US 10,790,387 B2
(45) Date of Patent: Sep. 29, 2020

(54) HIGH VOLTAGE LDMOS TRANSISTOR AND METHODS FOR MANUFACTURING THE SAME

(71) Applicant: Taiwan Semiconductor Manufacturing Company, Ltd.

(72) Inventors: Ker-Hsiao Huo, Hsinchu County (TW); Kong-Beng Thei, Hinschu Country (TW); Chien-Chih Chou, New Taipei (TW); Yi-Min Chen, Hsinchu (TW); Chen-Liang Chu, Hsinchu (TW)

(73) Assignee: TAIWAN SEMICONDUCTOR MANUFACTURING COMPANY LTD., Hsinchu ( * ) Notice: Subject to any disclaimer, the term of this patent is extended or adjusted under 35 U.S.C. 154(b) by 0 days.

(21) Appl. No.: 15/912,191

(22) Filed: Mar. 5, 2018

(65) Prior Publication Data

US 2018/0197985 A1    Jul. 12, 2018

Related U.S. Application Data

(63) Continuation of application No. 14/965,685, filed on Dec. 10, 2015, now Pat. No. 9,911,845.

(51) Int. Cl.
*H01L 29/78* (2006.01)
*H01L 29/423* (2006.01)
(Continued)

(52) U.S. Cl.
CPC ...... *H01L 29/7816* (2013.01); *H01L 29/0847* (2013.01); *H01L 29/1095* (2013.01);
(Continued)

(58) Field of Classification Search
CPC ............ H01L 29/7816; H01L 29/0847; H01L 29/1095; H01L 29/4238; H01L 29/66659;
(Continued)

(56) References Cited

U.S. PATENT DOCUMENTS 4,243,997 A    1/1981  Natori et al.
4,358,890 A *  11/1982 Heller ............ H01L 21/823406
                                                          438/148
(Continued)

FOREIGN PATENT DOCUMENTS

EP          0008691       3/1980

OTHER PUBLICATIONS

English Translation of Foreign Patent: EP 008691 A1.
Office Action from German Patent Office dated Aug. 29, 2016 for corresponding German application 102016100128.7.

*Primary Examiner* — Sheikh Maruf
(74) *Attorney, Agent, or Firm* — Haynes and Boone, LLP

(57) ABSTRACT

A semiconductor device is provided. The semiconductor device comprises a substrate, a gate, a first doped region and a second doped region. The gate is over the substrate. The first doped region and the second doped region are in the substrate. The first doped region and the second doped region are of a same conductivity type and separated by the gate. The length of the first doped region is greater than a length of the second doped region in a direction substantially perpendicular to a channel length defined between the first doped region and the second doped region.

20 Claims, 9 Drawing Sheets

(51) Int. Cl.
  *H01L 29/66* (2006.01)
  *H01L 29/08* (2006.01)
  *H01L 29/10* (2006.01)
  *H01L 29/06* (2006.01)

(52) U.S. Cl.
  CPC .... *H01L 29/4238* (2013.01); *H01L 29/66659* (2013.01); *H01L 29/66681* (2013.01); *H01L 29/7835* (2013.01); *H01L 29/0653* (2013.01); *H01L 29/0692* (2013.01); *H01L 29/42368* (2013.01)

(58) Field of Classification Search
  CPC ........... H01L 29/66681; H01L 29/7835; H01L 29/0653; H01L 29/0692; H01L 29/42368
  USPC .......................................................... 257/343
  See application file for complete search history.

(56) References Cited

U.S. PATENT DOCUMENTS

| | | | |
|---|---|---|---|
| 5,065,203 A * | 11/1991 | Yang | G11C 19/282 257/221 |
| 5,496,761 A * | 3/1996 | Ravanelli | H01L 29/0696 438/241 |
| 5,496,791 A | 3/1996 | Ohno et al. | |
| 6,236,084 B1 * | 5/2001 | Harada | H01L 21/823807 257/338 |
| 6,365,932 B1 * | 4/2002 | Kouno | H01L 27/0255 257/133 |
| 6,552,389 B2 * | 4/2003 | Yasuhara | H01L 29/402 257/335 |
| 7,315,052 B2 | 1/2008 | Alter et al. | |
| 7,968,941 B2 | 6/2011 | Fujita et al. | |
| 8,247,869 B2 | 8/2012 | Yang et al. | |
| 8,362,557 B2 | 1/2013 | Cai et al. | |
| 8,450,801 B2 | 5/2013 | Lin et al. | |
| 8,716,795 B2 | 5/2014 | You et al. | |
| 8,766,358 B2 | 7/2014 | Lee et al. | |
| 8,847,312 B2 | 9/2014 | Yang et al. | |
| 8,853,780 B2 | 10/2014 | Yang et al. | |
| 8,981,495 B2 | 3/2015 | Chuang et al. | |
| 9,520,367 B2 | 12/2016 | Gao et al. | |
| 9,553,188 B1 * | 1/2017 | Li | H01L 29/7835 |
| 2006/0186507 A1 * | 8/2006 | Kanda | H01L 29/7835 257/491 |
| 2007/0205461 A1 * | 9/2007 | Alter | H01L 29/78 257/341 |
| 2009/0020813 A1 * | 1/2009 | Voldman | H01L 21/823418 257/343 |
| 2009/0256199 A1 * | 10/2009 | Denison | H01L 29/66681 257/343 |
| 2010/0314683 A1 * | 12/2010 | Yanagi | H01L 29/6609 257/339 |
| 2011/0127607 A1 * | 6/2011 | Cai | H01L 29/7835 257/339 |
| 2012/0049277 A1 * | 3/2012 | Lin | H01L 29/0692 257/343 |
| 2012/0199905 A1 * | 8/2012 | Nitta | H01L 29/0847 257/343 |
| 2012/0205730 A1 * | 8/2012 | Chen | H01L 27/14609 257/292 |
| 2013/0015523 A1 * | 1/2013 | You | H01L 27/0922 257/343 |
| 2013/0087828 A1 * | 4/2013 | Koshimizu | H01L 21/82385 257/139 |
| 2013/0292764 A1 * | 11/2013 | Yang | H01L 29/063 257/336 |
| 2014/0027849 A1 * | 1/2014 | Yang | H01L 29/402 257/343 |
| 2014/0035033 A1 * | 2/2014 | Lim | H01L 29/7817 257/338 |
| 2014/0159139 A1 * | 6/2014 | Chuang | H01L 29/7816 257/327 |
| 2015/0189207 A1 * | 7/2015 | Chien | H04N 5/374 348/308 |
| 2017/0345660 A1 * | 11/2017 | Li | H01L 27/0255 |
| 2018/0277625 A1 * | 9/2018 | Takahashi | H01L 27/0928 |

\* cited by examiner

HIGH VOLTAGE LDMOS TRANSISTOR AND METHODS FOR MANUFACTURING THE SAME

PRIORITY DATA

The present application is a continuation application of U.S. patent application Ser. No. 14/965,685, filed Dec. 10, 2015, entitled "HIGH VOLTAGE LDMOS TRANSISTOR AND METHODS FOR MANUFACTURING THE SAME", each of which is hereby incorporated by reference in its entirety.

BACKGROUND

High voltage MOS transistors are semiconductor devices that can operate with high terminal voltages. High-voltage integrated circuits (ICs) that include high voltage MOS transistors are widely used in applications for the automobile industry, display drivers, portable telecommunication devices, medical equipment, and other areas. As an example, high voltage (e.g., greater than 20 volts) MOS transistors are integrated into a gate driver IC to deliver display signals to a liquid crystal display (LCD) panel. However, with the continuous process shrinking in advanced technology, breakdown voltages of these high voltage MOS transistors are also reduced. In addition, in order to increase saturation current of a high voltage MOS transistor, the on-resistance would be reduced, thereby the breakdown voltage of the high voltage MOS transistor would be reduced as well. It is desirable to increase saturation current of a high voltage MOS transistor without reducing the breakdown voltage of the high voltage MOS transistor.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

Figure 1A:
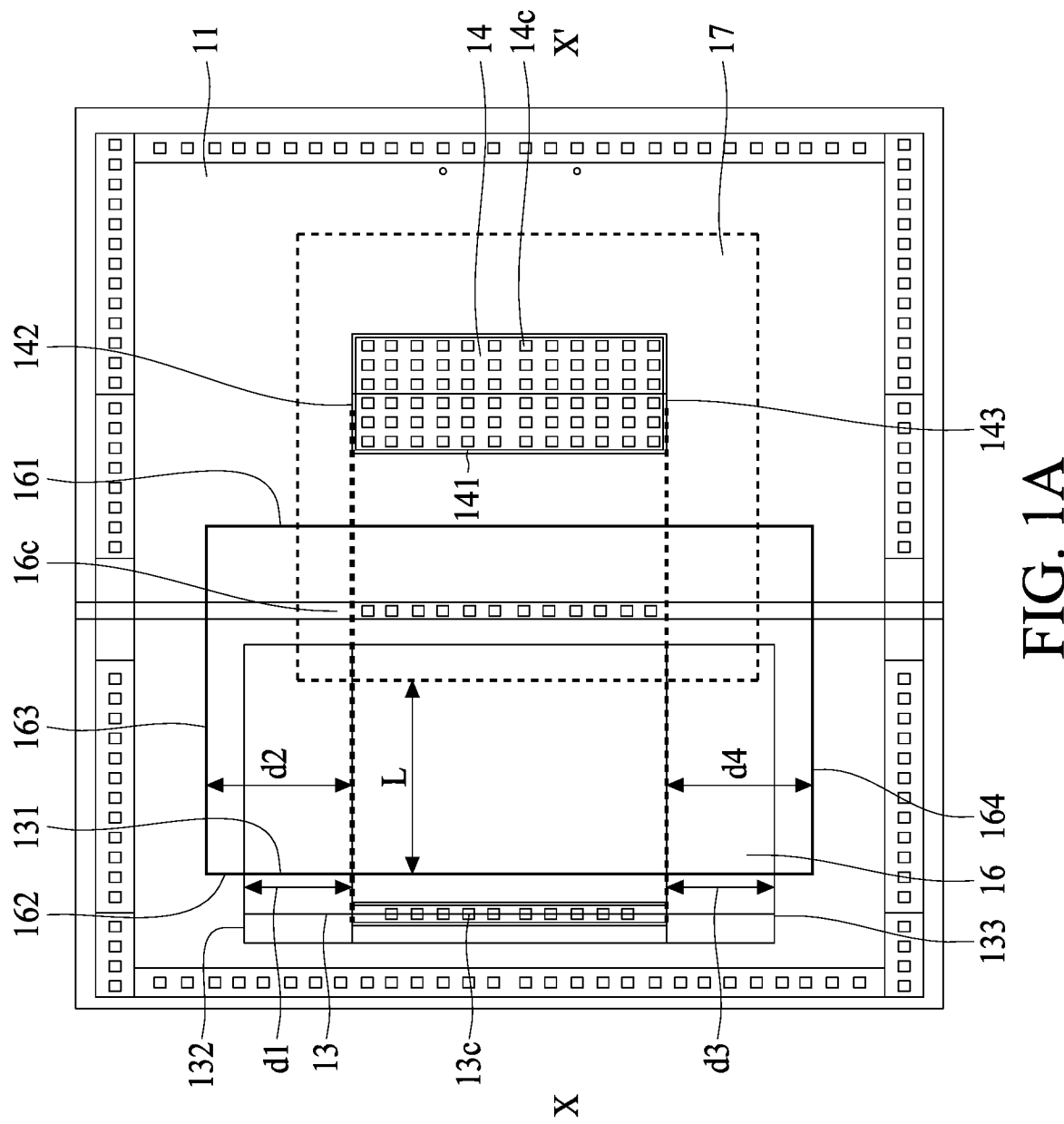
FIG. 1A is a top view of a high voltage LDMOS transistor, in accordance with some embodiments.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1A illustrates a top view of a high voltage LDMOS transistor 1 in accordance with one embodiment of the present disclosure. The high voltage LDMOS transistor 1 comprises a substrate 11, a well region 17, a source region 13, a drain region 14 and a gate 16.

The substrate 11 may be a p type doped substrate, or an n type doped substrate, which means that the semiconductor substrate 11 may be doped with either n type or p type impurities. The substrate 11 is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate 11.

It is appreciated that dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done through ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allows for in-situ doping during the epitaxial processes. It is common knowledge that implantation can be done through certain materials, such as thin oxide layers.

The doping concentration amounts for the well region 17 and the diffusions described may vary with the process used and the particular design. Doping concentrations at a p type material or an n type material may range from $10^{14}$ atoms/$cm^3$ to $10^{22}$ atoms/$cm^3$, with a p+/n+ material with concentrations being greater than about $10^{18}$/$cm^3$, for example. Some other ranges of concentrations may be used, such as an n−−/p−− material with a doping concentration less than $10^{14}$ atoms/$cm^3$, an n−/p− material with a doping concentration ranging from $10^{14}$ atoms/$cm^3$ to $10^{16}$ atoms/$cm^3$, an n/p material with a doping concentration ranging from $10^{16}$ atoms/$cm^3$ to $10^{18}$ atoms/$cm^3$, an n+/p+ material with a doping concentration ranging from $10^{18}$ atoms/$cm^3$ to $10^{20}$ atoms/$cm^3$, and an n++/p++ material with a doping concentration ranging larger than $10^{20}$ atoms/$cm^3$. Further alternative ranges of concentrations may be used, such as an n−−/p−− material with a doping concentration range around $10^{15}$ to $10^{18}$/$cm^3$, and an n−/p− material with a doping concentration 5 to 100 times heavier than the concentration of an n−−/p−− material.

The drain region 14 is within the well region 17. The drain region 14 has a plurality of drain contacts 14c. The drain region 14 is formed by implanting ions of an impurity of a first conductivity type, such as an n type, into the well region 17. The drain region 14 may be formed by implanting an n type dopant such as phosphorous to a concentration between about $1\times10^{19}$/$cm^3$ and about $2\times10^{21}$/$cm^3$, for example. Alternatively, other n type dopants such as arsenic, antimony, or combinations thereof, may also be used.

The source region 13 is within the substrate 11. The source region 13 has a plurality of source contacts 13c. The source region 13 is formed by implanting ions of an impurity of a first conductivity type, such as an n type, into the substrate 11. The source region 13 may be formed by implanting an n type dopant such as phosphorous to a concentration between about $1\times10^{19}$/$cm^3$ and about $2\times10^{21}$/$cm^3$, for example. Alternatively, other n type dopants such as arsenic, antimony, or combinations thereof, may also be used.

The drain region 14 is located at one side of the gate 16 and has a first edge 141 adjacent to a first edge 161 of the gate 16. The source region 13 is located at an opposing side of the gate 16 and has a first edge 131 adjacent to a second edge 162 of the gate 16. The first edge 131 of the source region 13 and the well region 17 define a channel length L.

The source region 13 has an extension of d1 in a direction substantially perpendicular to a channel length L. The extension d1 is measured from a second edge 142 of the drain region 14 to a second edge 132 of the source region 13. The second edge 142 of the drain region 14 is substantially perpendicular to the first edge 141 of the drain region 14. Moreover, the second edge 132 of the source region 13 is also substantially perpendicular to the first edge 131 of the source region 13. In one embodiment, the extension d1 is in a range from approximately 0.3 um to 1.2 um.

The source region 13 has another extension of d3 in a direction substantially perpendicular to a channel length L. The extension d3 is measured from a third edge 143 of the drain region 14 to an third edge 133 of the source region 13. The third edge 143 of the drain region 14 is opposite to the second edge 142 of the drain region 14. The third edge 133 of the source region 13 is opposite to the second edge 132 of the source region 13. In one embodiment, the extension d3 is in a range from approximately 0.3 um to 1.2 um. The length of extension d3 can be same as the extension d1. Alternatively the length of extension d3 can be different from the extension d1. In one embodiment, the source region 13 has two extensions. In another embodiment, the source region 13 may have only one extension depending on the requirement of design. The length of the source region 13 is approximately 0.3 um to 2.4 um greater than that of the drain region 14 in the direction perpendicular to channel length L.

The gate 16 is located above the substrate 11 and between the drain region 14 and the source region 13. The gate 16 has a plurality of gate contacts 16c. The gate 16 has an extension d2 in a direction substantially perpendicular to the channel length L. The extension d2 is measured from the second edge 142 of the drain region 14 to a third edge 163 of the gate 16. The third edge 163 of the gate is substantially perpendicular to the first edge 161 or the second edge 162 of the gate 16. In some embodiments, the gate 16 extends and protrudes over the second edge 132 of source region 13 from a top view perspective. In one embodiment, the extension d2 is in a range from approximately 0.3 um to 1.2 um.

The gate 16 has another extension of d4 in a direction substantially perpendicular to a channel length L. The extension d4 is measured from the third edge 143 of the drain region 14 to a fourth edge 164 of the gate 16. The fourth edge 164 of the gate is opposite to the third edge 163 of the gate 16. In one embodiment, the extension d4 is in a range from approximately 0.3 um to 1.2 um. The length of extension d4 can be same as the extension d2. Alternatively the length of extension d4 can be different from the extension d2. In one embodiment, the gate 16 has two extensions. In another embodiment, the gate 16 may have only one extension depending on the requirement of design. The length of the gate 16 is approximately 0.3 um to 2.4 um greater than that of the drain region 14 in the direction perpendicular to channel length L.

In the conventional technique, the on-resistance of the gate should be reduced in order to increase the saturation current of a high voltage LDMOS transistor. However, reducing the on-resistance would decrease the breakdown voltage of the high voltage LDMOS transistor as well, thereby affecting the performance of the high voltage LDMOS transistor. In accordance with the present disclosure, by extending the source region in the direction perpendicular to the channel, the equivalent channel width would be increase as well so as to increase the saturation current of the high voltage LDMOS transistor without changing the breakdown voltage of the transistor. In one embodiment, an increase of the saturation current of the high voltage LDMOS transistor would be in a range from approximately 1% to 2.4%. Increasing the saturation current of each transistor would reduce the total number of transistors in a chip, which would in turn reduce the chip area and manufacturing cost.

Figure 1B:
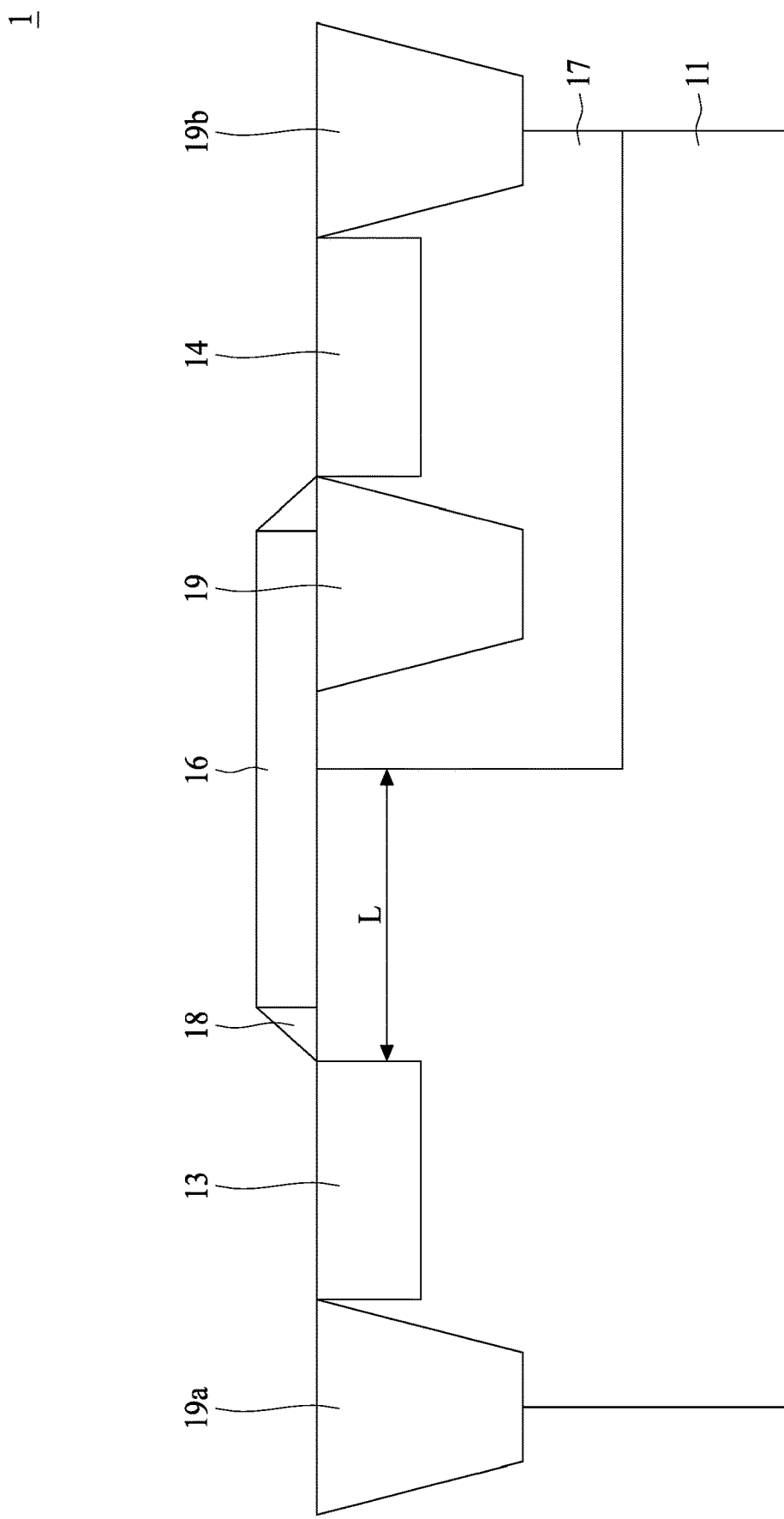
FIG. 1B is a cross-sectional view of a high voltage LDMOS transistor of FIG. 1A, in accordance with some embodiments.

FIG. 1B illustrates a cross-sectional view of the high voltage LDMOS transistor 1 in FIG. 1A, taken along the line X-X'. The high voltage LDMOS transistor 1 comprises a substrate 11, a well region 17, a source region 13, a drain region 14, a gate 16, spacers 18 and a plurality of insulation regions 19, 19a, 19b.

The well region 17 is within the substrate 11. The well region 17 surrounds the drain region 14. The source region 13 and the drain region 14 are surrounded by the substrate 11 and the well region 17 respectively. The gate 16 is on the substrate 11. The spacers 18 are located on the substrate and adjacent to both sides of the gate 16.

The insulation regions 19, 19a, 19b extend from a top surface of the well region 17 or the substrate 11 into the well region 17 or the substrate 11. The insulation regions 19a, 19b are used to isolate it from neighboring devices on the same substrate 11. The insulation region 19 is to reduce the electrical field near the drain region 14 of the high voltage LDMOS transistor 1. The insulation regions 19, 19a, 19b may be Shallow Trench Isolation (STI) regions. In another embodiment, insulation regions 19, 19a, 19b may also be other types of insulation regions such as field oxide regions.

Figure 2A:
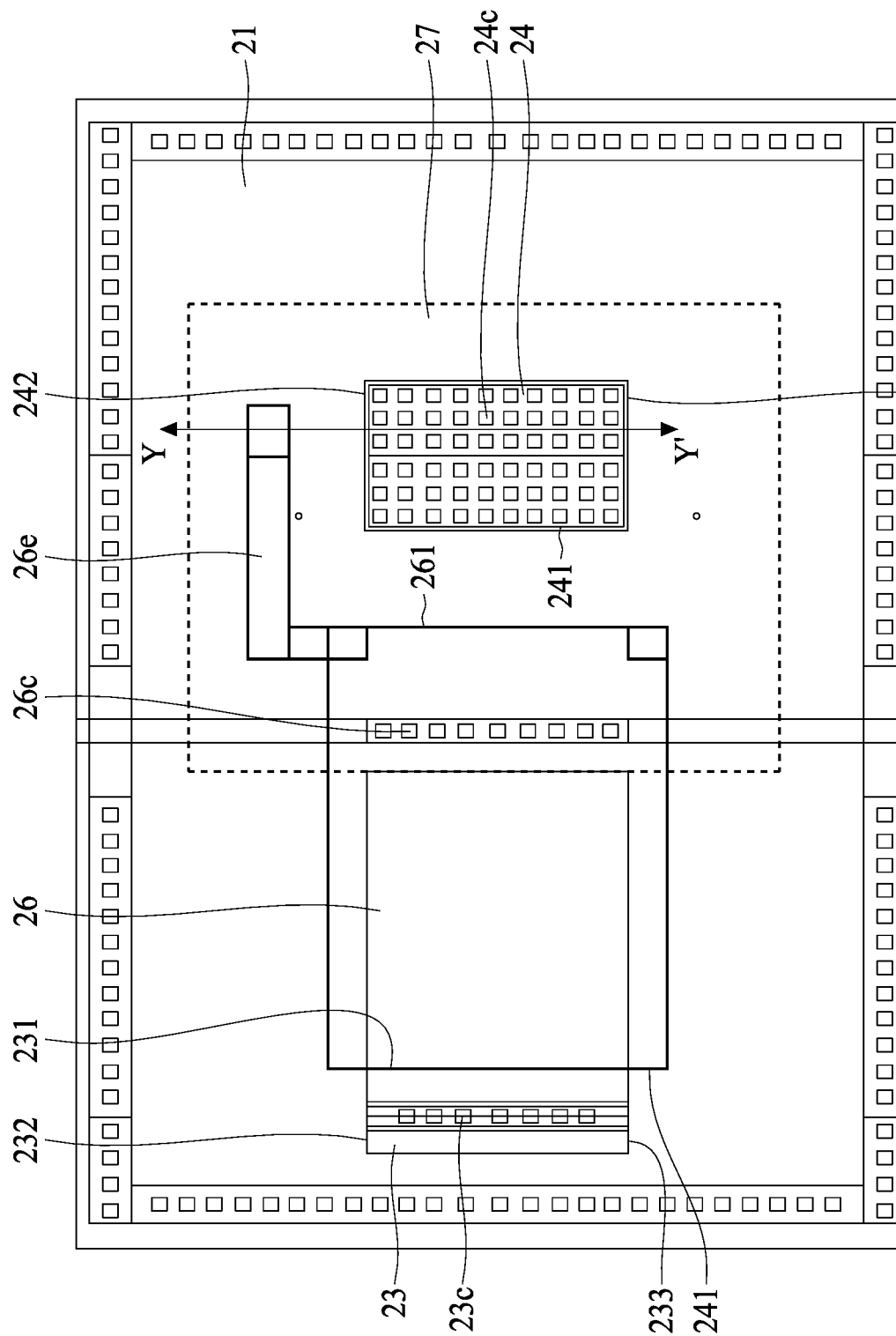
FIG. 2A is a top view of a high voltage LDMOS transistor, in accordance with some embodiments.

FIG. 2A illustrates a top view of a high voltage LDMOS transistor 2 in accordance with one embodiment of the present disclosure. The high voltage LDMOS transistor 2 comprises a substrate 21, a well region 27, a source region 23, a drain region 24 and a gate 26.

The substrate 21 may be a p type doped substrate, or an n type doped substrate, which means that the semiconductor substrate 21 may be doped with either n type or p type impurities. The substrate 21 is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate 21.

It is appreciated that dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done through ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allows for in-situ doping during the epitaxial processes. It is common knowledge that implantation can be done through certain materials, such as thin oxide layers.

The doping concentration amounts for the well region 27 and the diffusions described may vary with the process used and the particular design. Doping concentrations at a p type material or an n type material may range from $10^{14}$ atoms/cm$^3$ to $10^{22}$ atoms/cm$^3$, with a p+/n+ material with concentrations being greater than about $10^{18}$/cm$^3$, for example. Some other ranges of concentrations may be used, such as an n−−/p−− material with a doping concentration less than $10^{14}$ atoms/cm$^3$, an n−/p− material with a doping concentration ranging from $10^{14}$ atoms/cm$^3$ to $10^{16}$ atoms/cm$^3$, an n/p material with a doping concentration ranging from $10^{16}$ atoms/cm$^3$ to $10^{18}$ atoms/cm$^3$, an n+/p+ material with a doping concentration ranging from $10^{18}$ atoms/cm$^3$ to $10^{20}$ atoms/cm$^3$, and an n++/p++ material with a doping concentration ranging larger than $10^{20}$ atoms/cm$^3$. Further alternative ranges of concentrations may be used, such as an n−−/p−− material with a doping concentration range around $10^{15}$ to $10^{18}$/cm$^3$, and an n−/p− material with a doping concentration 5 to 100 times heavier than the concentration of an n−−/p−− material.

The drain region 24 is within the well region 27. The drain region 24 has a plurality of drain contacts 24c. The drain region 24 is formed by implanting ions of an impurity of a first conductivity type, such as an n type, into the well region 27. The drain region 24 may be formed by implanting an n type dopant such as phosphorous to a concentration between about $1\times10^{19}$/cm$^3$ and about $2\times10^{21}$/cm$^3$, for example. Alternatively, other n type dopants such as arsenic, antimony, or combinations thereof, may also be used.

The source region 23 is within the substrate 21. The source region 23 has a plurality of source contacts 23c. The source region 23 is formed by implanting ions of an impurity of a first conductivity type, such as an n type, into the substrate 21. The source region 23 may be formed by implanting an n type dopant such as phosphorous to a concentration between about $1\times10^{19}$/cm$^3$ and about $2\times10^{21}$/cm$^3$, for example. Alternatively, other n type dopants such as arsenic, antimony, or combinations thereof, may also be used.

The drain region 24 is located at one side of the gate 26 and has a first edge 241 adjacent to a first edge 261 of the gate 26. The source region 23 is located at an opposing side of the gate 26 and has a first edge 231 adjacent to the second edge 262 of the gate 26. The first edge 231 of the source region 23 and the well region 27 define a channel length L.

The gate 26 is located above the substrate 21 and between the source region 23 and the drain region 24. The gate 26 has an extension portion 26e extending along a second edge 242 of the drain region 24. The second edge 242 of the drain region 24 is substantially perpendicular to the first edge 241 of the drain region 24. In another embodiment, the extension portion 26e of the gate 26 may extend along a third edge 243 of the drain region 24. The third edge 243 of the drain region 24 is opposite to the second edge 242 of the drain region 24. Alternatively, the gate 26 may comprise two extension portions: one extending along the second edge 242 of the drain region 24 and the other extending along the third edge 243 of the drain region 24. In another embodiment, the gate 26 may comprise two extension portions: one extending along the second edge 242 of the drain regions 24 and the other extending along a second edge 232 of the source region 23. The second edge 232 of the source region 23 is substantially perpendicular to the first edge 231 of the source region 23. In another embodiment, the gate 26 may comprise four extension portions: one extending along the second edge 242 of the drain regions 24, another extending along the third edge 243 of the drain regions 24, another extending along the second edge 232 of the source regions 23 and the other extending along a third edge 233 of the source region 23. The third edge 233 of the source region is opposite to the second edge 232 of the source region 23.

When a positive voltage is applied to the gate 26 of the high voltage LDMOS transistor 2, the electrons can be transferred from the drain regions 24 in two ways: one is from the drain region 24 to the gate 26 and the other is from the drain region 24 to the extension portion 26e of the gate 26. Therefore, by extending the gate along an edge or two edges of the drain regions, the saturation current of the high voltage LDMOS transistor 2 will increase without changing the breakdown voltage of the transistor. In one embodiment, an increase of the saturation current of the high voltage LDMOS transistor 2 would be in a range from approximately 2% to 2.5%. Increasing the saturation current of each transistor would reduce the total number of transistors used in a chip, which would in turn reduce the chip area and manufacturing cost.

Figure 2B:
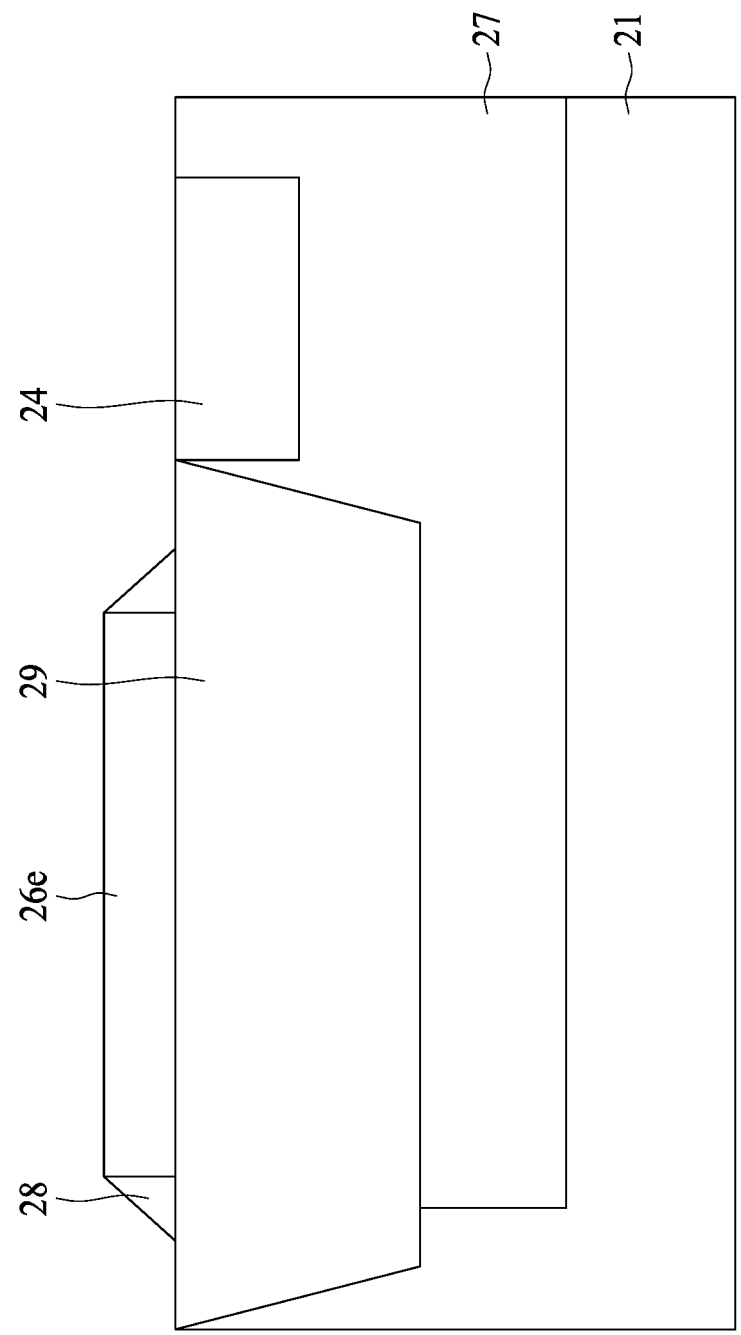
FIG. 2B is a cross-sectional view of a high voltage LDMOS transistor of FIG. 1A, in accordance with some embodiments.

FIG. 2B illustrates a cross-sectional view of the high voltage LDMOS transistor 2 in FIG. 2A, taken along the line Y-Y'. The high voltage LDMOS transistor 2 shown in FIG. 2B comprises a substrate 21, a well region 27, a drain region 24, an extension portion 26e of the gate, spacers 28 and an insulation regions 29.

The well region 27 is within the substrate 21. The well region 27 surrounds the drain region 24. The extension portion 26e of the gate is on the substrate 21. The spacers 28 are located on the substrate 21 and adjacent to both sides of the extension portion 26e of the gate.

The insulation region 29 extends from a top surface of the well region 27 or the substrate 21 into the well region 27 or the substrate 21. The insulation region 29 may be a Shallow Trench Isolation (STI) region. In another embodiment, the insulation region 29 may also be other types of insulation regions such as a field oxide regions Since the gate 26 in FIG. 2A has the extension portion 26e extending along the second edge 242 of the drain region 24, it can be seen from FIG. 2B that the gate 26e is on the substrate 21 even if the cross-sectional view is taken along in a direction perpendicular to the channel length L. When a positive voltage is applied to the gate of the high voltage LDMOS transistor 2, the electrons would be accumulated to the edges of the insulation region 29 by the extension portion 26e of the gate. Therefore, in addition to the path from the drain region 24 to the gate 26, the electrons can be also transferred from the drain region 24 to the extension portion 26e of the gate 26. Therefore, by extending the gate along an edge or two edges of the drain regions, the saturation current of the high voltage LDMOS transistor 2 will increase without changing the breakdown voltage of the high voltage LDMOS transistor. Increasing the saturation current of each transistor would reduce the total number of transistors used in a chip, which would in turn reduce the chip area and manufacturing cost.

Figure 3:
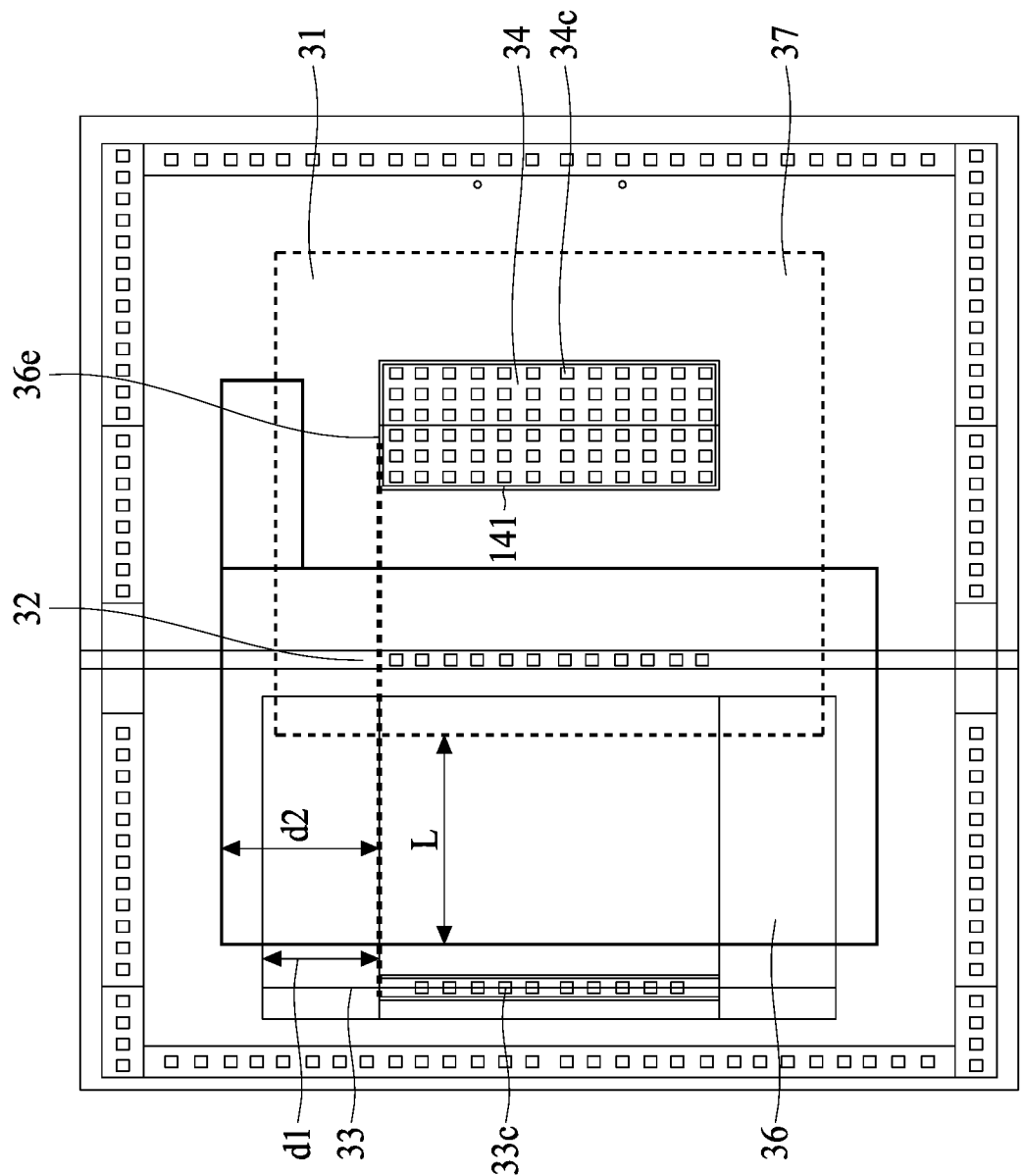
FIG. 3 is a top view of a high voltage LDMOS transistor, in accordance with some embodiments.

FIG. 3 illustrates a top view of a high voltage LDMOS transistor 3 in accordance with one embodiment of the present disclosure. The high voltage LDMOS transistor comprises a substrate 31, a well region 37, a source region 33, a drain region 34 and a gate 36.

The high voltage LDMOS transistor 3 in FIG. 3 is similar to the high voltage LDMOS transistor 1 in FIG. 1A except that the gate 36 of the high voltage LDMOS transistor 3 further comprises an extension portion 36e. The extension portion 36e of the gate 36 extends along an edge of the drain region 34. In another embodiment, the extension portion 36e of the gate 36 may extend along an opposing edge of the drain region 34. Alternatively, the gate 36 may comprise two extension portions: one extending along an edge of the drain region 34 and the other extending along an opposing edge of the drain region 34. In another embodiment, the gate 36 may comprise two extension portions: one extending along an edge of the drain regions 34 and the other extending along an edge of the source region 33.

The high voltage LDMOS transistor 3 has the extended source region 33 as shown in FIG. 1A and the extended gate 36e as shown in FIG. 2A. Therefore, the high voltage LDMOS transistor 3 has greater saturation current in comparison with that in FIG. 1A or FIG. 2A. In one embodiment, an increase of the saturation current of the high voltage LDMOS transistor 2 would be in a range from approximately 2% to 2.5%. Increasing the saturation current of each transistor would reduce the number of the total transistors used in a chip, which would in turn reduce the chip area and manufacturing cost.

FIGS. 4A-4D illustrate, in cross-sectional views, a method of manufacturing a high voltage LDMOS transistor, in accordance with some embodiments. The resulting high voltage LDMOS transistor may be the high voltage LDMOS transistor 1 shown in FIG. 1B. Alternative methods may be used to make the high voltage LDMOS transistor 1 shown in FIG. 1B.

Figure 4A:
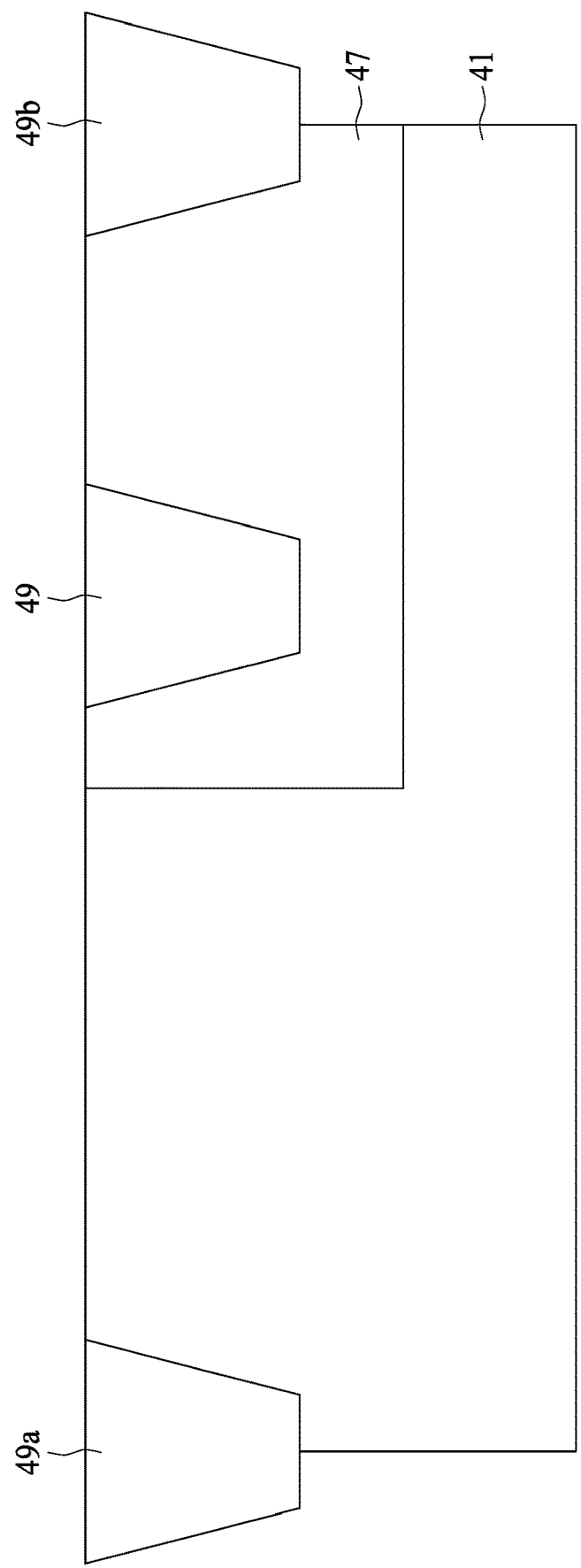
FIGS. 4A-4D illustrate a process of manufacturing a high voltage LDMOS transistor, in accordance with some embodiments.

As illustrated in FIG. 4A, a p type substrate 41 is provided. A photolithography process is applied to an oxide layer (not shown) on the substrate 41 to form photoresist pattern for selective implantation of n type dopants. The n type dopants are then driven into the substrate 41 by a thermal process to form an n type well region 47. The well region 47 forms an extension of the drain of an N-channel enhanced mode, high voltage LDMOS transistor to be formed subsequently. In other embodiments, the well region 47 is formed by phosphorus diffusion. The well region 47 may extend to a depth in a range from approximately 1.5 μm to 5.0 μm in the substrate 41.

Then, selective oxidation may be performed to form insulation regions 49, 49a, 49b. The insulation regions 49a, 49b are used to isolate the high voltage LDMOS transistor to be formed from neighboring devices on the same substrate. The insulation region 49 is formed to reduce the electrical field near the drain region of the high voltage LDMOS transistor to be formed.

Figure 4B:
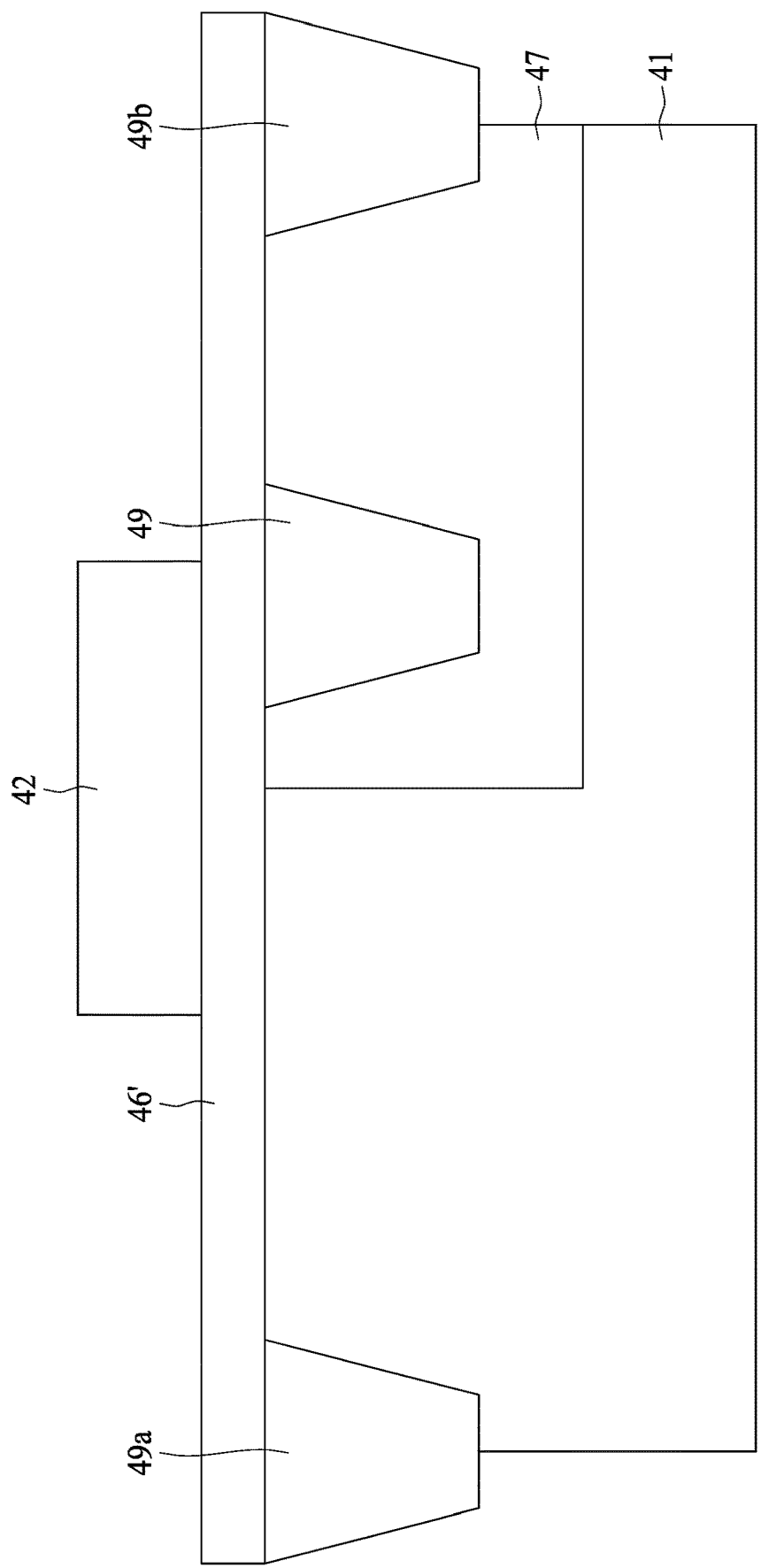

In FIG. 4B, a poly layer 46' having a thickness in a range from about 2000 Å to about 5000 Å is formed on the substrate 41. A chemical vapor deposition (CVD) process may be used to form the poly layer 46', although other suitable processes may be used. A photolithography process is then applied to form photoresist pattern 42 for creating a gate of the high voltage LDMOS transistor to be formed.

Figure 4C:
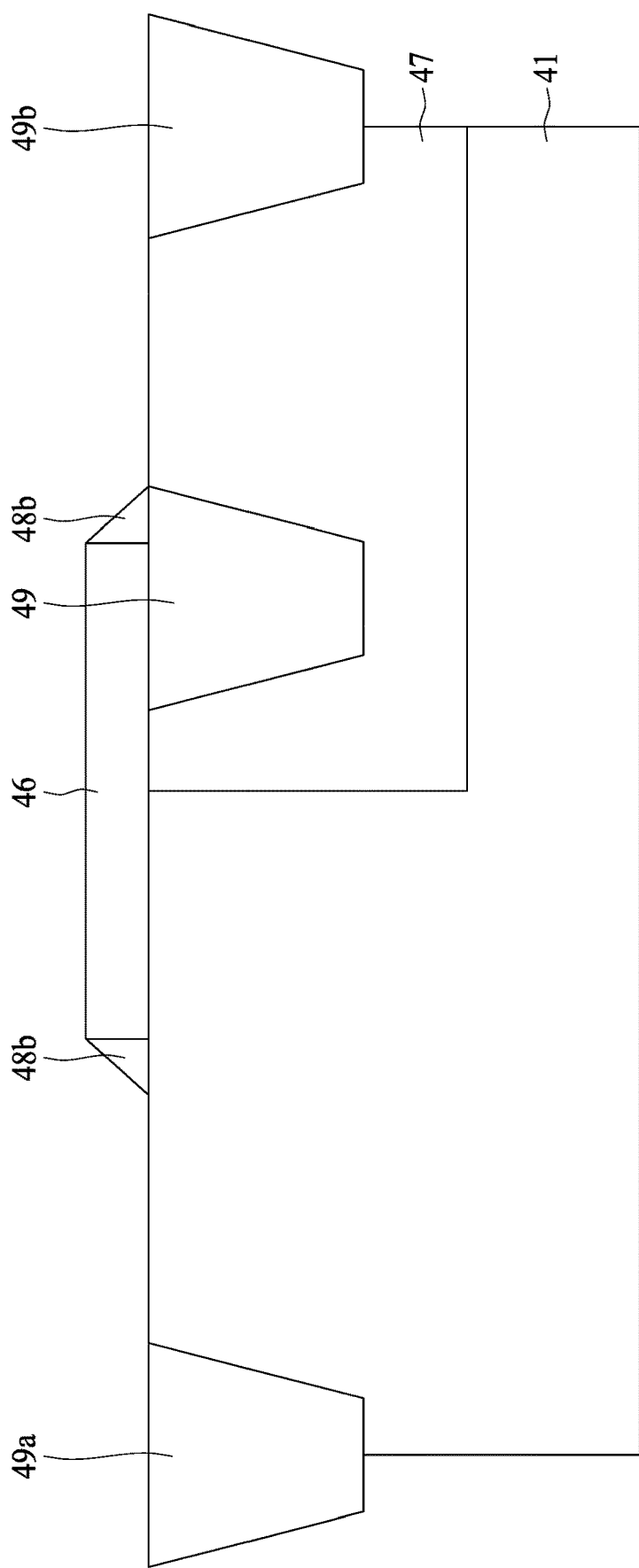

Referring to FIG. 4C, an anisotropic etch process, such as a plasma dry etch process, is applied to the substrate 41, creating the gate 46. After the gate is created, a TEOS oxide film of thickness from about 500 Å to about 3000 Å is deposited on the substrate 41. A dry-etch process is then applied to the substrate 11, which removes the oxide from the flat areas while leaving gate spacers 48a, 48b at the sidewalls of the gate 46. Other spacer dielectric materials, such as Si$_3$N$_4$, can also be used. Alternatively, prior to the formation of the gate spacers 48a, 48b, a shallow and lightly doped n type region (not shown) may be formed between the insulation regions 49a, 49b and the gate 46.

Figure 4D:
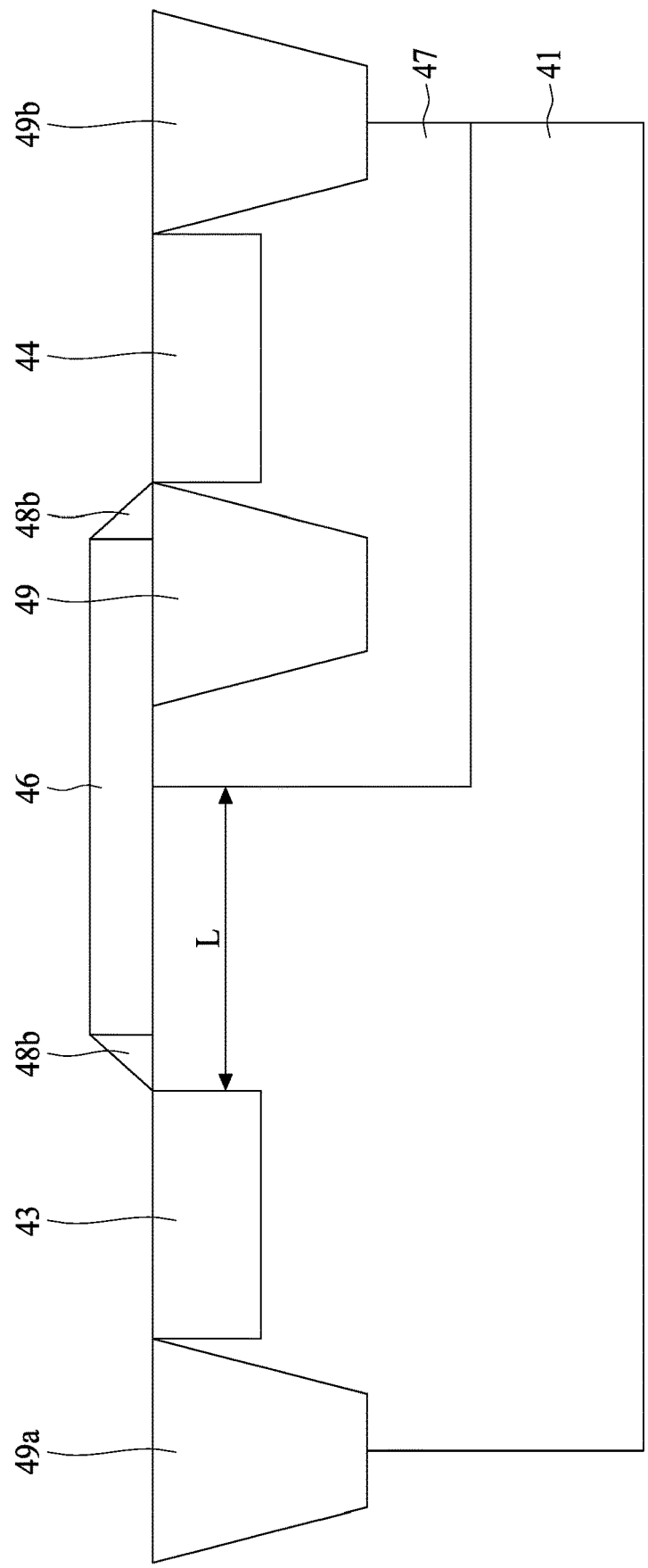

Referring to FIG. 4D, after the formation of the spacers, a heavy and deep n type ion implantation is conducted to form a source region 43 and a drain region 44. Preferably, this is a self-aligned process where the edges of the source region 43 are defined by the patterning of the insulation region 49a and gate spacer 48a, and the edges of the drain region 44 are defined by the patterning of the insulation region 49b and the gate spacer 48b. A silicide layer (not shown) may be selectively formed on the top surface of the source/drain regions 43, 44, and the gate 46 to reduce the resistance of the source/drain and gate regions. The process of making the LDMOS transistor in this preferred embodiment is completed by forming metal contacts (not shown) to the gate 46, the source region 43, and the drain region 44, by use of known materials and methods, for example.

During the formation of the source region 43 and the drain region 44, the length of the source region 43 is formed to be greater than that of the drain region 44 in a direction substantially perpendicular to a channel length L. The source region 43 is about 0.3 um to 2.4 um longer than the drain region 44 in length.

In view of the above, a preferred aspect of the present disclosure is to provide a high voltage LDMOS transistor having greater saturation current while keeping the same breakdown voltage by extending the source region and/or extending the gate. Increasing the saturation current of each transistor would reduce the total number of transistors used in a chip, which would in turn reduce the chip area and manufacturing cost.

In accordance with embodiments of the present disclosure, a semiconductor device comprises a substrate, a gate, a first doped region and a second doped region. The gate is over the substrate. The first doped region and the second doped region are in the substrate. The first doped region and the second doped region are of a same conductivity type and separated by the gate. The length of the first doped region is greater than a length of the second doped region in a direction substantially perpendicular to a channel length defined between the first doped region and the second doped region.

In accordance with an embodiment, a high-voltage MOSFET comprises a substrate, a gate, a first doped region and a second doped region. The gate is over the substrate. The first doped region and a second doped region are in the substrate. The first doped region and the second doped region are of a same conductivity type and separated by the gate. The gate includes an extension extending along an edge of the second doped region at a direction substantially parallel to a channel length defined between the first doped region and the second doped region.

In accordance with another embodiment, a method of manufacturing a high-voltage MOSFET comprises: forming a substrate; forming a gate on the substrate; forming a first doped region in the substrate; and forming a second region in the substrate. The first doped region and the second doped region are of a same conductivity type and separated by the gate. The length of the first doped region is greater than the length of the second doped region in a direction substantially perpendicular to a channel length defined between the first doped region and the second doped region.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. A semiconductor device, comprising:
   a gate over a substrate, the gate having a main portion and an extension portion contiguous with and disposed at one end of the main portion; and
   a source region and a drain region in the substrate, wherein the gate is disposed between the source region and the drain region, and wherein a length of the source region is greater than the length of the drain region in a direction substantially perpendicular to a channel length defined between the source region and the drain region;
      wherein the main portion of the gate has a first sidewall substantially perpendicular to a channel length and disposed over the source region, a second sidewall opposite the first sidewall, the second sidewall disposed interposing the source region and the drain region, a third sidewall substantially parallel to the channel length, and a fourth sidewall opposing the third sidewall, wherein each of the first, second, third, and fourth sidewalls extend vertically above the substrate, and wherein the extension portion extends from the second sidewall and the third sidewall toward the drain region in the direction substantially parallel to the channel length; and
      gate spacers on the main portion and the extension portion of the gate.

2. The semiconductor device of claim 1, wherein each of the main portion of the gate and the extension portion of the gate affect transfer of electrons from the drain region, the main portion of the gate disposed adjacent a first edge of the drain region and the extension portion of the gate disposed adjacent a second edge of the drain region, the first edge being substantially perpendicular to the second edge.

3. The semiconductor device of claim 1, further comprising:
   a first plurality of contacts interfacing the drain region, wherein the first plurality of contacts extend the length of the drain region.

4. The semiconductor device of claim 3, further comprising: a second plurality of contacts, wherein the second plurality of contacts interface the source region.

5. The semiconductor device of claim 4, wherein the second plurality of contacts extends a portion of the source region having a length equal to the length of the drain region such that each end region of the source region is without contacts.

6. The semiconductor device of claim 1, at least one contact interfacing the main portion of the gate.

7. The semiconductor device of claim 1, wherein the source region has an extension of a first distance in a direction substantially perpendicular to the channel length.

8. The semiconductor device of claim 7, wherein a contact does not overlie the extension of the source region.

9. A MOSFET, comprising:
a gate over a substrate;
a first doped region and a second doped region in the substrate, wherein the first doped region and the second doped region are of a same conductivity type and the gate is disposed between the first doped region and the second doped region;
wherein the gate includes an extension portion having a first sidewall extending along an edge of the second doped region at a direction substantially parallel to a channel length extending between the first doped region and the second doped region, a second sidewall opposing and substantially parallel to the first sidewall, and a third sidewall connecting the first and second sidewalls and extending at a direction substantially perpendicular to the channel length, wherein upon application of a positive voltage the MOSFET is configured to affect electron flow from the second doped region by the gate including the extension portion; and
gate spacers disposed on the first sidewall and the second sidewall.

10. The MOSFET of claim 9, wherein the positive voltage affects electron flow from the second doped region by the gate including the extension portion by providing electrons in a first direction parallel to the channel length and in a second direction perpendicular to the channel length.

11. The MOSFET of claim 10, wherein the electrons provided in the second direction flow from the extension portion of the MOSFET.

12. The MOSFET of claim 9, wherein the first doped region and the second doped region have a substantially similar length in the direction substantially perpendicular to the channel length.

13. The MOSFET of claim 9, wherein the first doped region has a first length in the direction substantially perpendicular to the channel length and the second doped region has a second length in the direction substantially perpendicular to the channel length, wherein the first length is greater than the second length.

14. The MOSFET of claim 9, wherein the first doped region has an edge aligned with a gate spacer of the gate and the second doped region has an edge aligned with another gate spacer of the gate.

15. A high-voltage MOSFET comprising:
a gate over a substrate, wherein the gate has a main portion having a first sidewall and a second sidewall opposing the first sidewall, wherein the first sidewall and second sidewall extend in a direction substantially perpendicular a channel length;
a first doped region in the substrate on one side of the channel length;
a second doped region in the substrate on the other side of the channel length, wherein the first doped region and the second doped region are of a same conductivity type and the gate is between an edge of the first doped region and an edge of the second doped region, wherein the first sidewall of the gate is nearer the second doped region than the second sidewall of the gate; and
wherein the gate further comprises an extension portion contiguous with the main portion, the extension portion having:
a third sidewall extending from the first sidewall of the main portion and extending in a direction substantially parallel the channel length towards the second doped region;
a fourth sidewall extending from the third sidewall and extending in a direction substantially perpendicular the channel length, the third sidewall being non-collinear with the first sidewall; and
a fifth sidewall opposing the third sidewall and collinear with a sixth sidewall of the main portion, the sixth sidewall of the main portion extending between the first and second sidewalls, wherein each of the first, second, third, fourth, fifth and sixth sidewalls extend vertically upward from a top surface of a substrate.

16. The MOSFET of claim 15 wherein the MOSFET is operable, when a voltage to the gate, to transfer electrons from the second region in a first direction towards the main portion of the gate and transfer electrons from the second region in a second direction towards the extension portion of the gate.

17. The MOSFET of claim 15, wherein the first and second directions are substantially perpendicular.

18. The MOSFET of claim 15, wherein a length of the first doped region is greater than a length of the second doped region in a direction substantially perpendicular to a channel length.

19. The MOSFET of claim 15, wherein the first doped region and the second doped region include phosphorous.

20. The MOSFET of claim 15, wherein the first doped region and the second doped region includes an edge of the first doped region and an edge of the second doped region aligned to gate spacers of the gate.

* * * * *